US012641738B2

(12) United States Patent
Chai et al.

(10) Patent No.: US 12,641,738 B2
(45) Date of Patent: May 26, 2026

(54) FOLDING MECHANISM AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Chaoyang District (CN)

(72) Inventors: Yuanyuan Chai, Beijing (CN); Wei Qing, Beijing (CN); Jun Zhang, Beijing (CN); Lei Zhang, Beijing (CN); Zhihui Wang, Beijing (CN); Chuankun You, Beijing (CN)

(73) Assignees: Chengdu BOE Optoelectronics Technology Co., Ltd., Chengdu (CN); BOE Technology Group Co., Ltd., Chaoyang District (CN)

(*) Notice: Subject to any disclaimer, the term of this patent is extended or adjusted under 35 U.S.C. 154(b) by 226 days.

(21) Appl. No.: 18/704,604

(22) PCT Filed: Aug. 31, 2022

(86) PCT No.: PCT/CN2022/116190
§ 371 (c)(1),
(2) Date: Apr. 25, 2024

(87) PCT Pub. No.: WO2024/045038
PCT Pub. Date: Mar. 7, 2024

(65) Prior Publication Data
US 2026/0006733 A1 Jan. 1, 2026

(51) Int. Cl.
*H05K 5/02* (2006.01)
*F16C 11/12* (2006.01)

(52) U.S. Cl.
CPC ............ *H05K 5/0226* (2013.01); *F16C 11/12* (2013.01)

(58) Field of Classification Search
CPC ..... H05K 5/0226; H05K 5/0017; F16C 11/12; G06F 1/1652; G06F 1/1681; G06F 1/161;
(Continued)

(56) References Cited

U.S. PATENT DOCUMENTS 11,681,335 B1 * 6/2023 Hsu ........................ G06F 1/1681
361/679.01
12,389,558 B2 * 8/2025 Shin ....................... G06F 1/1616
(Continued)

FOREIGN PATENT DOCUMENTS

CN 110582804 A 12/2019
CN 110958337 A 4/2020
(Continued)

*Primary Examiner* — Abhishek M Rathod
(74) *Attorney, Agent, or Firm* — The Webb Law Firm

(57) ABSTRACT

A folding mechanism includes a covering member and a hinge assembly. The covering member includes a bearing groove extending in a first direction. Each hinge assembly includes a first module base and a second module base that are disposed in the bearing groove, a first support plate and a second support plate that are disposed on opposite sides of a first axis of the bearing groove, and a tension module. The first module base is fixed to the covering member. The second module base is capable of sliding with respect to the first module base in a second direction. The first support plate is connected to the first module base. The second support plate is connected to the second module base. The first support plate is capable of rotating relative to the first module base. The second support plate is capable of rotating relative to the second module base.

19 Claims, 7 Drawing Sheets

(58) Field of Classification Search
CPC ........ G06F 1/1641; G06F 1/16; G06F 1/1613;
G06F 1/1624; G06F 1/1643; G06F
1/1656
See application file for complete search history.

(56) References Cited

U.S. PATENT DOCUMENTS

| | | | | |
|---|---|---|---|---|
| 2020/0348732 A1* | 11/2020 | Kang | .................... | E05D 3/122 |
| 2021/0119171 A1* | 4/2021 | Kim | .................... | G06F 1/1616 |
| 2021/0195775 A1 | 6/2021 | Zhao et al. | | |
| 2022/0104370 A1* | 3/2022 | Wu | .................... | G06F 1/1681 |
| 2022/0159109 A1* | 5/2022 | Kang | .................... | G06F 1/1616 |
| 2022/0217859 A1* | 7/2022 | Lee | .................... | G06F 1/1652 |

FOREIGN PATENT DOCUMENTS

| | | | |
|---|---|---|---|
| CN | 111343310 A | 6/2020 |
| CN | 112492071 A | 3/2021 |
| CN | 112788162 A | 5/2021 |
| CN | 113436537 A | 9/2021 |
| CN | 214274224 U | 9/2021 |
| CN | 113689789 A | 11/2021 |
| CN | 113936551 A | 1/2022 |
| CN | 114076144 A | 2/2022 |
| CN | 114170909 A | 3/2022 |
| CN | 114302002 A | 4/2022 |
| CN | 114627760 A | 6/2022 |

* cited by examiner

FOLDING MECHANISM AND DISPLAY DEVICE

CROSS-REFERENCE TO RELATED APPLICATION

This application is the United States national phase of International Patent Application No. PCT/CN2022/116190, filed Aug. 31, 2022, the disclosure of which is hereby incorporated by reference in its entirety.

BACKGROUND OF THE INVENTION

Field of the Invention

The present disclosure relates to the field of display technologies, and in particular, to a folding mechanism and a display device.

Description of Related Art

With the development of flexible organic electroluminescent display devices (e.g., organic light-emitting diode (OLED) devices), forms of display devices are becoming more and more abundant. Folding display devices can be switched between a folded state and an unfolded state, which can meet the user's requirements for large-size display. The folding display devices have become a symbol of research and development capabilities of major manufacturers.

SUMMARY OF THE INVENTION

In an aspect, a folding mechanism is provided, which is applied to a display device. The folding mechanism includes a covering member and at least one hinge assembly. The covering member includes a bearing groove extending in a first direction, and the bearing groove has a first axis extending in the first direction. Each hinge assembly in the at least one hinge assembly includes a first module base, a second module base, a first support plate, a second support plate, and a tension module.

The first module base and the second module base are disposed in the bearing groove; the first module base is fixed to the covering member, and the second module base is capable of sliding back and forth with respect to the first module base in a second direction. The second direction is perpendicular to the first direction, and a plane where the first direction and the second direction are located is parallel to a plane where the display device is in an unfolded state.

The first support plate and a second support plate are disposed on opposite sides of the first axis; the first support plate is connected to the first module base, and the second support plate is connected to the second module base. The first support plate is capable of rotating relative to the first module base, and the second support plate is capable of rotating relative to the second module base, so that the display device is folded or unfolded. A first surface of the first support plate and a first surface of the second support plate are configured to install a flexible display panel thereon.

The tension module is used to push the second module base to slide in the second direction away from the first module base when the display device is in the unfolded state, so as to enable the second support plate to move away from the first support plate.

In some embodiments, the hinge assembly further includes a gear set, the gear set includes a plurality of co-moving gears for driving linkage between the first support plate and the second support plate.

In some embodiments, the tension module includes a spring and a cam component. An axial direction of the spring is parallel to the second direction, a first end of the spring is fixed relative to the covering member, and a second end of the spring is against the second module base.

The cam component is disposed on a side of the first end of the spring away from the second end of the spring, and the cam component is configured as: during rotation of the display device from a folded state to the unfolded state, under force of the cam component, make the second end of the spring push the second module base to slide in the second direction away from the first module base, so that the second support plate is away from the first support plate; and during rotation of the display device from the unfolded state to the folded state, under the force of the cam component, make the second module base compress the spring, and make the second module base slide in the second direction close to the first module base, so that the second support plate is close to the first support plate.

In some embodiments, the cam component includes a co-moving gear shaft and a cam collar, and the cam collar is fixed to the second module base. A first end of the co-moving gear shaft is coaxially fixed with one co-moving gear in the plurality of co-moving gears, and a second end of the co-moving gear shaft penetrates through the cam collar; the co-moving gear shaft is capable of rotating relative to the cam collar. A portion, penetrating through the cam collar, of the co-moving gear shaft is provided a depression therein, and the depression extends along an axial direction of the co-moving gear shaft.

The cam collar includes a body portion and a protruding portion; the protruding portion is disposed on a side of the body portion away from the spring, and a protruding block is formed at a connection between the protruding portion and the body portion; the protruding block faces an inside of the cam collar and matches the depression.

When the display device is in the unfolded state, the protruding block is engaged into the depression, and the second module base is away from the first module base. When the display device is in the folded state or in a third state between the folded state and the unfolded state, the depression is separated from the protruding block, and the second module base slides in the second direction close to the first module base.

In some embodiments, the tension module further includes a first guide member fixed to the covering member; the first guide member is used to guide the spring to extend out and retract in the second direction.

In some embodiments, the first guide member includes a stop plate and a guide shaft fixed to the stop plate, and the stop plate is fixed to the covering member. An axial direction of the guide shaft is parallel to the second direction, the spring is coaxially sleeved on the guide shaft, and the first end of the spring is against the stop plate.

In some embodiments, the second module base is provided with a first accommodation cavity therein, and the first guide member and the spring are disposed in the first accommodation cavity.

In some embodiments, the plurality of co-moving gears include an even number of co-moving gears that mesh in sequence, and the even number of co-moving gears are arranged symmetrically with respect to the first axis; an axial direction of a co-moving gear is parallel to the first direction.

The gear set further includes a gear base, a first gear rod and a second gear rod. The gear base is fixed to the covering member, and the co-moving gear is capable of rotating around the axial direction of the co-moving gear relative to the gear base. The first gear rod and the second gear rod are arranged symmetrically with respect to the first axis. Two co-moving gears, relatively far away from the first axis, in the even number of co-moving gears are a first co-moving gear and a second co-moving gear. A first end of the first gear rod is fixed to an outer edge of the first co-moving gear, and a second end of the first gear rod extends in a direction perpendicular to the first direction. A first end of the second gear rod is fixed to an outer edge of the second co-moving gear, and a second end of the second gear rod extends in the direction perpendicular to the first direction. The first gear rod is used to drive the first support plate to rotate, and the first support plate is capable of moving relative to the first gear rod. The second gear rod is used to drive the second support plate to rotate, and the second support plate is capable of moving relative to the second gear rod.

In some embodiments, the first module base is provided with a second accommodation cavity therein, and the second module base is disposed in the second accommodation cavity. The folding mechanism further includes a second guide member disposed between the first module base and the second module base; the second module base is slidably connected to the first module base through the second guide member, so that the second module base slides back and forth in the second direction relative to the first module base.

In some embodiments, the second guide member includes a second guide rail and a second guide rail groove; the second guide rail is fixed to a first side wall of the first module base facing the second accommodation cavity; the first side wall extends in the second direction, and the second guide rail extends in the second direction. The second guide rail groove is disposed on a side wall of the second module base; the second guide rail groove is matched with the second guide rail, and the second guide rail groove is capable of sliding back and forth along the second guide rail.

In some embodiments, the folding mechanism further includes a support bracket fixed on the first module base, and the support bracket is fixed on a second side wall of the first module base facing the second accommodation cavity; the second side wall extends in the first direction. The support bracket is located on a side of the cam collar in the first direction; the support bracket is used to support the co-moving gear shaft, and the co-moving gear shaft is capable of rotating relative to the support bracket.

In some embodiments, the second side wall of the first module base is provided therein with an evading depression for accommodating the cam collar, and the evading depression is communicated with the second accommodation cavity. When the display device is from the unfolded state to the folded state, the cam collar moves in the second direction close to the evading depression, so that the second support plate is close to the first support plate.

In some embodiments, the folding mechanism further includes a first connection member disposed between the first gear rod and the first support plate; through the first connection member, the first gear rod drives the first support plate to rotate, and the first support plate is capable of moving relative to the first gear rod. And/or the folding mechanism further includes a second connection member disposed between the second gear rod and the second support plate; through the second connection member, the second gear rod drives the second support plate to rotate, and the second support plate is capable of moving relative to the second gear rod.

In some embodiments, the first connection member includes a first clamping hole, a first waist-hole and a first connection shaft. The first clamping hole is disposed on the second end of the first gear rod, and an axial direction of the first clamping hole is perpendicular to an extending direction of the first gear rod. The first waist-hole is disposed on a side of the first support plate facing the first gear rod, and the first waist- hole corresponds to the first clamping hole. The first connection shaft passes through the first clamping hole and the first waist-hole, and the first connection shaft is capable of moving relative to the first waist-hole.

The second connection member includes a second clamping hole, a second waist-hole and a second connection shaft. The second clamping hole is disposed on the second end of the second gear rod, and an axial direction of the second clamping hole is perpendicular to an extending direction of the second gear rod. The second waist-hole is disposed on a side of the second support plate facing the second gear rod, and the second waist-hole corresponds to the second clamping hole. The second connection shaft passes through the second clamping hole and the second waist-hole, and the second connection shaft is capable of moving relative to the second waist-hole.

In some embodiments, the covering member has an arc-shaped cross-section in the second direction. The covering member includes a first end plate, a second end plate and a side wall plate; the first end plate is disposed at an end of the covering member in a direction of the first axis, the second end plate is disposed at another end of the covering member in the direction of the first axis, and the side wall plate is located between the first end plate and the second end plate; the first end plate, the second end plate and the side wall plate are fixedly connected and enclosed to form the bearing groove.

In some embodiments, the folding mechanism further includes a third guide member disposed between the first support plate and the first module base, and the first support plate is rotationally connected to the first module base through the third guide member, so that the first support plate rotates relative to the first module base.

The folding mechanism further includes a fourth guide member disposed between the second support plate and the second module base, and the second support plate is rotationally connected to the second module base through the fourth guide member, so that the second support plate rotates relative to the second module base.

In some embodiments, the third guide member includes a first boss, a third guide rail and a third guide rail groove. The first boss is fixed on a second surface of the first support plate, and the second surface of the first support plate and the first surface of the first support plate are opposite surfaces of the first support plate. The first module base is further provided with a third accommodation cavity therein, and the first boss is located in the third accommodation cavity.

The third guide rail groove is disposed on the first boss, and the third guide rail groove is semicircular in an extending direction thereof; the third guide rail is fixed on a side wall of the first module base facing the third guide rail groove, and is matched with the third guide rail groove; the third guide rail is capable of sliding along the third guide rail groove.

The fourth guide member includes a second boss, a fourth guide rail and a fourth guide rail groove. The second boss is fixed on a second surface of the second support plate, and the second surface of the second support plate and the first surface of the second support plate are opposite surfaces of the second support plate. The second module base is further provided with a first accommodation cavity therein, and the second boss is located in the first accommodation cavity.

The fourth guide rail groove is disposed on the second boss, and the fourth guide rail groove is semicircular in an extending direction thereof; the fourth guide rail is fixed on a side wall of the second module base facing the fourth guide rail groove, and is matched with the fourth guide rail groove; the fourth guide rail is capable of sliding along the fourth guide rail groove.

In some embodiments, the at least one hinge assembly includes two hinge assemblies, one hinge assembly is disposed at one end of the covering member along the first axis, and another hinge assembly is disposed at another end of the covering member along the first axis. First support plates of the two hinge assemblies are located on a same side of the first axis.

In some embodiments, the folding mechanism further includes a first middle frame and a second middle frame. The first middle frame is fixedly connected to the first support plate, and a first surface of the first middle frame is configured to support the flexible display panel; the first surface of the first middle frame and the first surface of the first support plate are in a same plane. The second middle frame is fixedly connected to the second support plate, and a first surface of the second middle frame is configured to support the flexible display panel; the first surface of the second middle frame and the first surface of the second support plate are in a same plane.

When the display device is in the unfolded state, the first surface of the first middle frame, the first surface of the first support plate, the first surface of the second middle frame, and the first surface of the second support plate are in a same plane.

In another aspect, a display device is provided. The display device includes a folding mechanism and a flexible display panel. The folding mechanism is the folding mechanism according to any one of the above embodiments. The flexible display panel is disposed on a bearing surface of the folding mechanism, and the bearing surface includes the first surface of the first support plate and the first surface of the second support plate.

BRIEF DESCRIPTION OF THE DRAWINGS

In order to describe technical solutions in the present disclosure more clearly, the accompanying drawings to be used in some embodiments of the present disclosure will be introduced briefly. Obviously, the accompanying drawings to be described below are merely drawings of some embodiments of the present disclosure, and a person of ordinary skill in the art can obtain other drawings according to those drawings. In addition, the accompanying drawings to be described below may be regarded as schematic diagrams, but are not limitations on actual sizes of products, actual processes of methods and actual timings of signals involved in the embodiments of the present disclosure.

DESCRIPTION OF THE INVENTION

Figure 1:
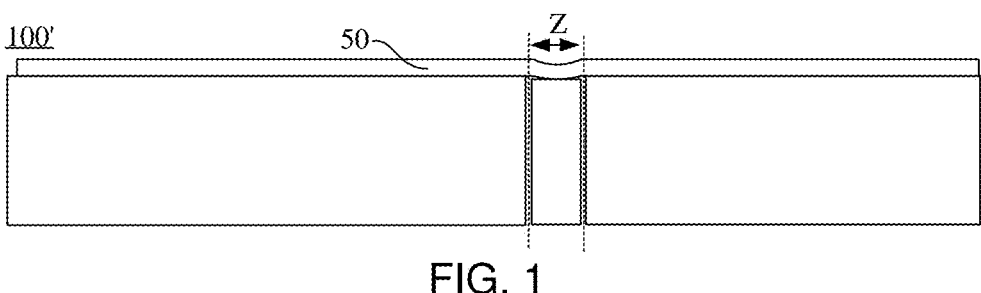
FIG. 1 is a structural diagram showing an unfolded state of a display device, in accordance with some embodiments.

The technical solutions in some embodiments of the present disclosure will be described clearly and completely with reference to the accompanying drawings. Obviously, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the specification and the claims, the term "comprise" and other forms thereof such as the third-person singular form "comprises" and the present participle form "comprising" are construed as an open and inclusive meaning, i.e., "including, but not limited to". In the description of the specification, the terms such as "one embodiment", "some embodiments", "exemplary embodiments", "example", "specific example", or "some examples" are intended to indicate that specific features, structures, materials, or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics may be included in any one or more embodiments or examples in any suitable manner.

Hereinafter, the terms "first" and "second" are used for descriptive purposes only, and are not to be construed as indicating or implying a relative importance or implicitly indicating a number of indicated technical features. Thus, the feature defined with "first" or "second" may explicitly or implicitly include one or more of the features. In the description of the embodiments of the present disclosure, the term "a plurality of" or "the plurality of" means two or more unless otherwise specified.

The phrase "at least one of A, B and C" has a same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

The term such as "about", "substantially", or "approximately" as used herein includes a stated value and an average value within an acceptable range of deviation of a particular value. The acceptable range of deviation is determined by a person of ordinary skill in the art, considering measurement in question and errors associated with measurement of a particular quantity (i.e., limitations of a measurement system).

The term such as "parallel", "perpendicular", or "equal" as used herein includes a stated condition and a condition similar to the stated condition. A range of the similar condition is within an acceptable deviation range, and the acceptable deviation range is determined by a person of ordinary skill in the art, considering measurement in question and errors associated with measurement of a particular quantity (i.e., the limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°; and the term "equal" includes absolute equality and approximate equality, and an acceptable range of deviation of the approximate equality may be, for example, that a difference between two equals is less than or equal to 5% of either of the two equals.

The folding mobile phone products currently sold on the market mainly include water drop-shaped products and U-shaped inner folding products, which may have creases after consumers use them for a period of time. As shown in FIG. 1, a display device 100' can be a folding mobile phone. After the folding mobile phone is used for a period of time, a depression will be formed in the area Z where the flexible display panel 50 (i.e., the screen) is bent, which appears as the crease on the flexible display panel 50.

The main reason for the crease is that there are many polymer materials in materials used in the flexible display panel 50, these polymer materials cause creep damage during static bending and fatigue damage during dynamic bending processes, resulting in unrecoverable residual deformation remaining in the flexible display panel 50.

However, because the polymer materials in folding screens must simultaneously meet multiple requirements such as optical properties, mechanical strength, and bending capabilities, there is very limited room for improvement in polymer materials.

Figure 2:
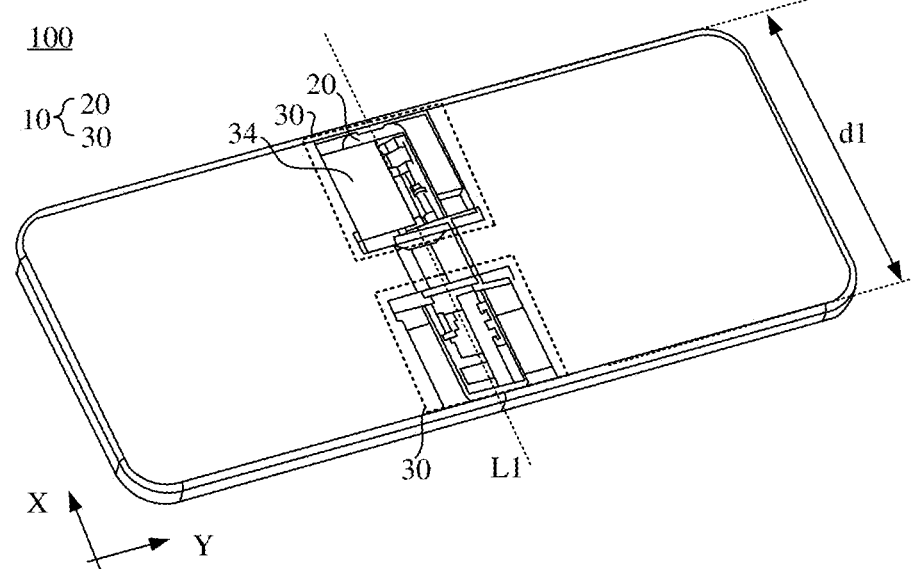
FIG. 2 is a structural diagram showing an unfolded state of a display device, in accordance with some embodiments of the present disclosure.
Figure 3:
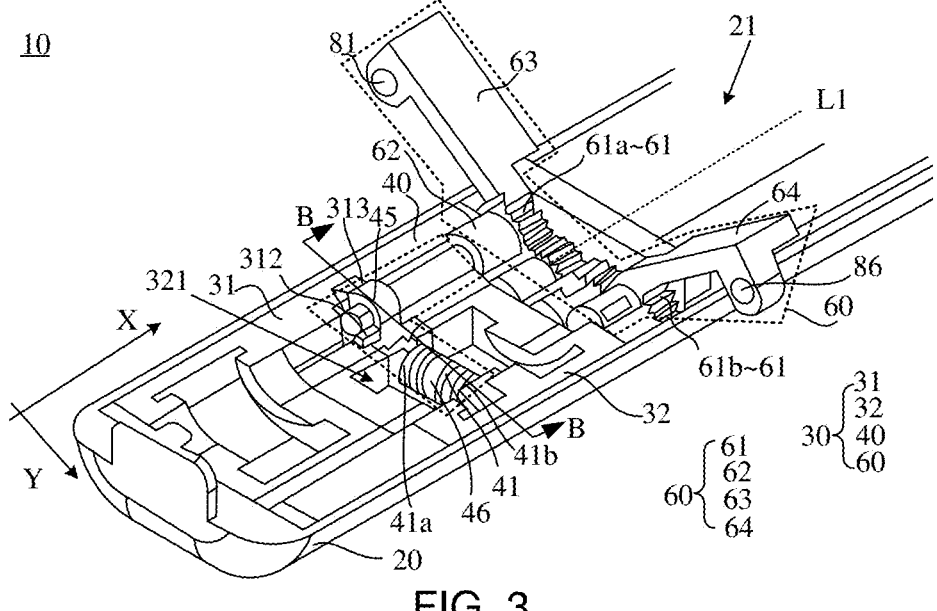
FIG. 3 is a structural diagram of a folding mechanism, in accordance with some embodiments of the present disclosure.
Figures 4, 5:
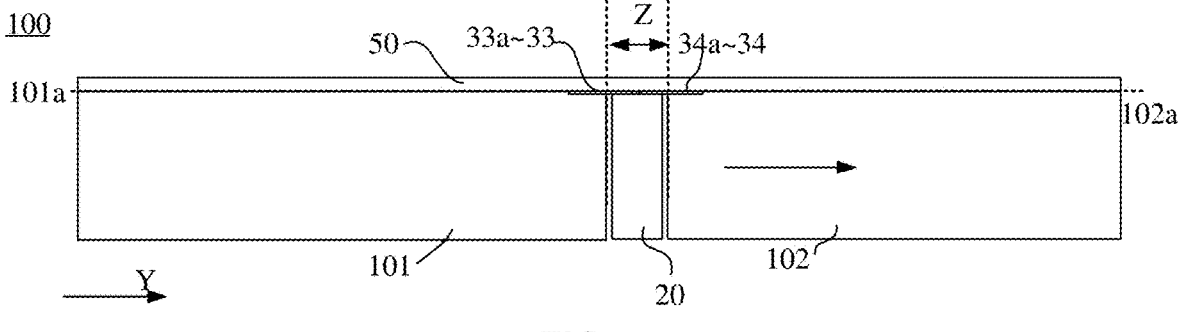
FIG. 4 is a diagram showing a disassembled structure of a folding mechanism, in accordance with some embodiments of the present disclosure.
FIG. 5 is another structural diagram showing an unfolded state of a display device, in accordance with some embodiments of the present disclosure.

In light of this, embodiments of the present disclosure provide a folding mechanism 10. As shown in FIG. 2, the folding mechanism 10 is applied to a display device 100. As shown in FIGS. 3 and 4, the folding mechanism 10 includes a covering member 20 and at least one hinge assembly 30. The covering member 20 includes a bearing groove 21 extending in a first direction X, and the bearing groove 21 has a first axis L1 extending in the first direction X.

For example, as shown in FIG. 2, the folding mechanism 10 includes the covering member 20 and two hinge assemblies 30. In some other examples, depending on the width of the display device 100, there may be three hinge assemblies 30 or four hinge assemblies 30, which is not limited here.

The width of the display device 100 is the dimension d1 of the display device 100 in the first direction X.

For example, as shown in FIG. 2, the covering member 20 is disposed in the middle along a length direction of the display device 100, and the display device 100 is folded or unfolded under the control of the hinge assembly(s) 30. The length direction of the display device 100 is perpendicular to the first direction X along which the width of the display device 100 lies.

As shown in FIG. 4, each hinge assembly 30 in the at least one hinge assembly 30 includes: a first module base 31, a second module base 32, a first support plate 33, a second support plate 34 and a tension module 40. The first module base 31 and the second module base 32 are disposed in the bearing groove 21. The first module base 31 is fixed to the covering member 20, and the second module base 32 can slide back and forth with respect to the first module base 31 in a second direction Y. The second direction Y is perpendicular to the first direction X, and the plane where the first direction X and the second direction Y are located is parallel to the plane of the display device 100 (see FIG. 2) when it is in the unfolded state.

For example, as shown in FIG. 4, the hinge assembly(s) 30 disposed in the bearing groove 21 each have the first module base 31 and the second module base 32, the first module base 31 is fixed to the covering member 20, and the second module base 32 can slide back and forth in the second direction Y with respect to the first module base 31 (that is, the second module base 32 can slide back and forth in the length direction of the display device 100 (see FIG. 2).

As shown in FIG. 4, the first support plate 33 and the second support plate 34 are disposed on opposite sides of the first axis L1. The first support plate 33 is connected to the first module base 31, and the second support plate 34 is connected to the second module base 32. The first support plate 33 can rotate relative to the first module base 31 in a direction around a first virtual axis within a preset angle range, and the second support plate 34 can rotate relative to the second module base 32 in a direction around a second virtual axis within the preset angle range, so that the display device 100 is folded or unfolded. A first surface 33a of the first support plate 33 and a first surface 34a of the second support plate 34 are configured to install the flexible display panel 50 (see FIG. 5) thereon.

For the positions of the first virtual axis and the second virtual axis, reference can be made to the subsequent content and will not be described here.

For example, as shown in FIG. 4, the first surface 33a of the first support plate 33 and the first surface 34a of the second support plate 34 are used to install the flexible display panel 50. Since the first support plate 33 is connected to the first module base 31, and the second support plate 34 is connected to the second module base 32, when the second module base 32 moves away from the first module base 31 in the second direction Y (i.e., the length direction of the display device 100), it will drive the second support plate 34 to be away from the first support plate 33 in the second direction Y. Thus, the function of stretching and flattening the area Z of the flexible display panel 50 installed on the first surface 33a of the first support plate 33 and the first surface 34a of the second support plate 34 at the position of the first axis L1 is realized, so as to make the crease disappear (as shown in FIG. 5).

It should be noted that the preset angle range is set according to the actual situation. Generally, the display device 100 is in the unfolded state, which means that the position where the first surface 33a of the first support plate 33 and the first surface 34a of the second support plate 34 are located in the same plane is the initial position, i.e., 0°. The first support plate 33 rotates around the first virtual axis, and at the same time, the second support plate 34 rotates around the second virtual axis until the first surface 33a of the first support plate 33 and the first surface 34a of the second support plate 34 are in contact, i.e., 90°. That is, the preset angle range is in a range of 0° to 90°, inclusive.

As shown in FIG. 4, when the display device 100 is in the unfolded state, the tension module 40 is used to push the second module base 32 to slide in the second direction Y away from the first module base 31, so as to enable the second support plate 34 to move away from the first support plate 33.

For example, as shown in FIG. 4, the function of the tension module 40 is that when the display device 100 is in the unfolded state, the tension module 40 can push the second module base 32 to slide in the second direction Y away from the first module base 31. That is, the arrangement of the tension module 40 is only used to stretch and flatten the area Z of the flexible display panel 50 at the position of the first axis L1 when the display device 100 is in the unfolded state (as shown in FIG. 5).

Therefore, in the embodiments of the present disclosure, by arranging the tension module 40, when the display device 100 is in the unfolded state, the second module base 32 slides away from the first module base 31 in the second direction Y, and then drives the second support plate 34 connected to the second module base 32 to be away from the first support plate 33, so as to achieve the purpose of tightening and unfolding the crease of the flexible display panel 50. The technical solution adopted in the embodiments of the present disclosure to eliminate the screen crease can reduce the space occupied by each module and achieve a small-size design of the display device 100, which is in line with the development trend of light weight and small thickness and has a low cost. Compared with conventional technologies, this technical solution reduces the cost of the hinge assembly 30 by 20% compared with conventional hinges.

Moreover, the flexible display panel 50 of the display device 100 provided by this technical solution can remain flat without creases after long-term use, and has a long service life.

In some embodiments, as shown in FIGS. 3 and 4, the hinge assembly 30 further includes a gear set 60. The gear set 60 includes a plurality of co-moving gears 61 for driving the linkage between the first support plate 33 and the second support plate 34.

As shown in FIG. 4, the linkage between the first support plate 33 and the second support plate 34 means that the co-moving gears 61 included in the gear set 60 are used to drive the first support plate 33 and the second support plate 34 to rotate simultaneously. That is, when the first support plate 33 rotates around the first virtual axis, the second support plate 34 rotates around the second virtual axis. Or, the first support plate 33 and the second support plate 34 rotate to the folded state at the same time, and the angle and speed of rotation are consistent.

Figure 6:
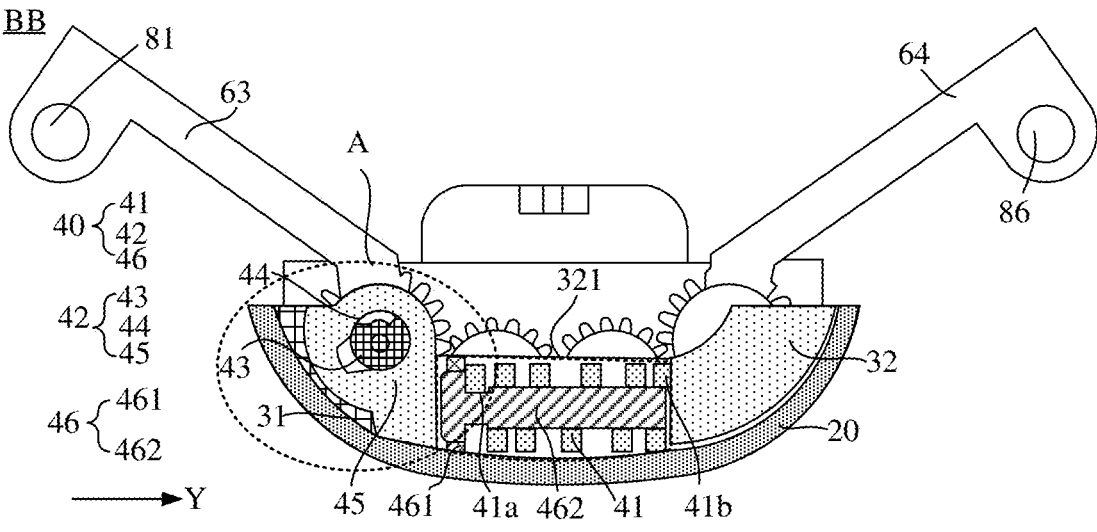
FIG. 6 is a sectional view obtained based on the structural diagram of the folding mechanism along the section line BB shown in FIG. 3.
Figure 7:
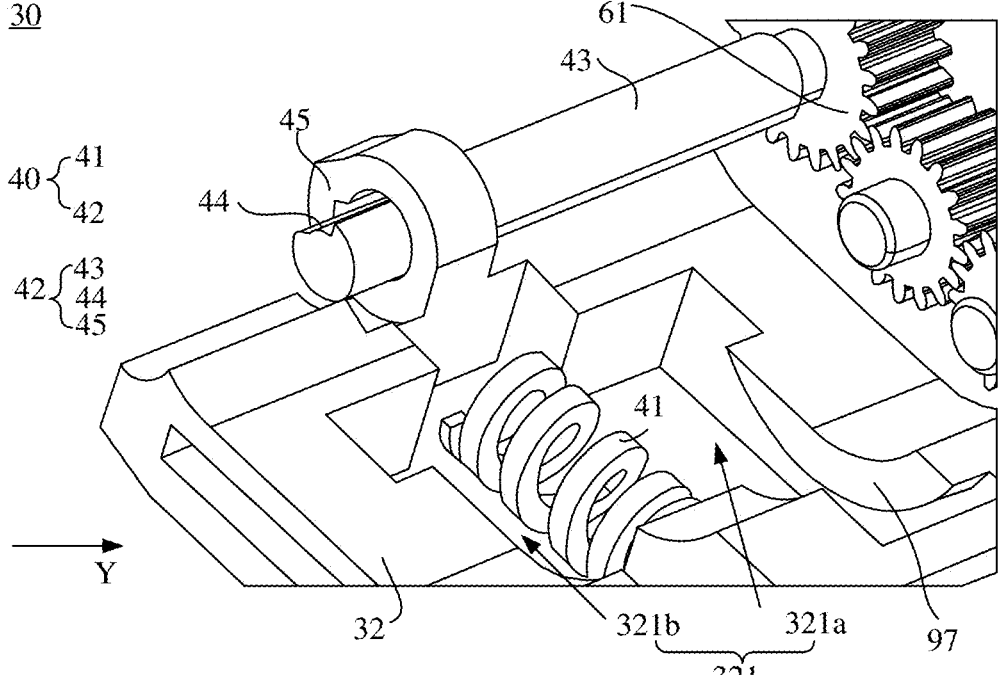
FIG. 7 is a structural diagram showing a second module base, a tension module and a gear set, in accordance with some embodiments of the present disclosure.

In some embodiments, as shown in FIGS. 6 and 7, the tension module 40 includes a spring 41 and a cam component 42. An axial direction of the spring 41 is parallel to the second direction Y, a first end 41a of the spring 41 is fixed relative to the covering member 20, and a second end 41b of the spring 41 is against the second module base 32. In a case where the spring 41 is in a compressed state, the tension of the second end 41b of the spring 41 is used to push the second module base 32 to slide in the second direction Y away from the first module base 31.

The cam component 42 is disposed on a side of the first end 41a of the spring 41 away from the second end 41b of the spring 41. The cam component 42 is configured as follows.

During the rotation of the display device 100 from the folded state to the unfolded state, under the force of the cam component 42, the second end 41b of the spring 41 pushes the second module base 32 to slide in the second direction Y away from the first module base 31, so that the second support plate 34 is away from the first support plate 33. During the rotation of the display device 100 from the unfolded state to the folded state, under the force of the cam component 42, the second module base 32 compresses the spring 41, and the second module base 32 slides in the second direction Y close to the first module base 31, so that the second support plate 34 is close to the first support plate 33.

In some examples, FIG. 6 is a sectional view of the axial direction of the spring 41, and it can be seen from the figure that the cam component 42 is arranged on the left side of the spring 41 (i.e., the side of the first end 41a of the spring 41 away from the second end 41b of the spring 41), and the cam component 42 can control the compression state of the spring 41 when the display device 100 is in the folded state and the unfolded state.

When the display device 100 is in the folded state, the spring 41 is in the first compressed state. In this case, the second end 41b of the spring 41 tends to push the second module base 32 to slide in the second direction Y away from the first module base 31 (that is, there is tension). However, due to the force of the cam component 42, the possibility that the second end 41b of the spring 41 pushes the second module base 32 to slide is limited, thereby blocking the second module base 32 from sliding. Thus, the first module base 31 and the second module base 32 are in a relatively close state. It can be understood that the first support plate 33 connected to the first module base 31 and the second support plate 34 connected to the second module base 32 are relatively close to each other. In this state, no additional tensile force is applied to the flexible display panel 50. With such an arrangement, the impact of the tension module 40 on the flexible display panel 50 may be avoided, which is beneficial to improving the service life of the flexible display panel 50.

When the display device 100 is in the unfolded state, the spring 41 is in the second compressed state. In this case, the second end 41b of the spring 41 has the tendency to push the second module base 32 to slide in the second direction Y away from the first module base 31 (that is, there is tension), and the second end 41b of the spring 41 can push the second module base 32 to slide due to the arrangement of the cam component 42. Thus, the first module base 31 and the second module base 32 are in a relatively far state. For example, compared with the folded state of the display device 100, a distance between the first module base 31 and the second module base 32 may be increased by 0.1 mm to 1 mm. It can be understood that, in this case, a distance between the first support plate 33 and the second support plate 34 is also increased by 0.1 mm to 1 mm, which will stretch and flatten a portion of the flexible display panel 50 located in the area Z (see FIG. 5), and eliminate the crease.

Therefore, when the display device 100 rotates from the folded state to the unfolded state, and when the display device 100 rotates from the unfolded state to the folded state, the cam component 42 has the function for controlling whether the tension of the second end 41*b* of the spring 41 pushes the second module base 32 to slide in the second direction Y away from the first module base 31.

It should be noted that, since the first support plate 33 is connected to the first module base 31 and the second support plate 34 is connected to the second module base 32, when the second module base 32 is far away from the first module base 31, the second support plate 34 is also far away from the first support plate 33. Similarly, when the second module base 32 is close to the first module base 31, the second support plate 34 is also close to the first support plate 33.

Moreover, as shown in FIG. 6, in order to more clearly understand relative positional relationships between the second module base 32, the first module base 31, the spring 41 and the cam component 42, the first support plate 33 and the second support plate 34 are not shown in the figure. For the positions of the first support plate 33 and the second support plate 34, reference may be made to FIG. 4.

The specific structure of the cam component 42 is as follows.

In some embodiments, as shown in FIG. 7, the cam component 42 includes a co-moving gear shaft 43 and a cam collar 45, and the cam collar 45 is fixed to the second module base 32. A first end of the co-moving gear shaft 43 is coaxially fixed with one co-moving gear 61 in the plurality of co-moving gears 61, and a second end of the co-moving gear shaft 43 penetrates through the cam collar 45. The co-moving gear shaft 43 can rotate relative to the cam collar 45. A depression 44 is provided in a portion of the co-moving gear shaft 43 that penetrates through the cam collar 45, and the depression 44 extends along the axial direction of the co-moving gear shaft 43.

That is, the co-moving gear shaft 43 rotates simultaneously with the co-moving gear 61 coaxially connected thereto. Thus, the depression 44 on the co-moving gear shaft 43 rotates with the rotation of the co-moving gear shaft 43, and the opening of the depression 44 faces different directions.

Figure 8:
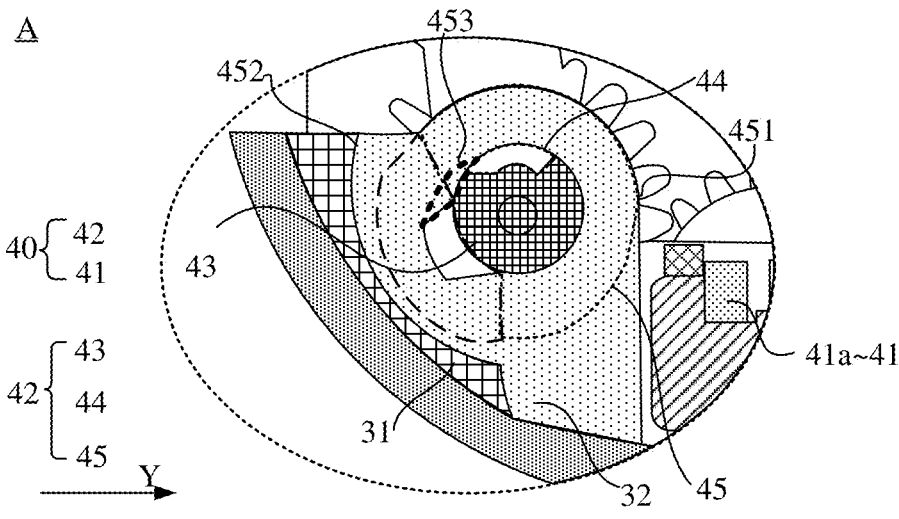
FIG. 8 is an enlarged view of the area A of the sectional view shown in FIG. 6.
Figure 9:
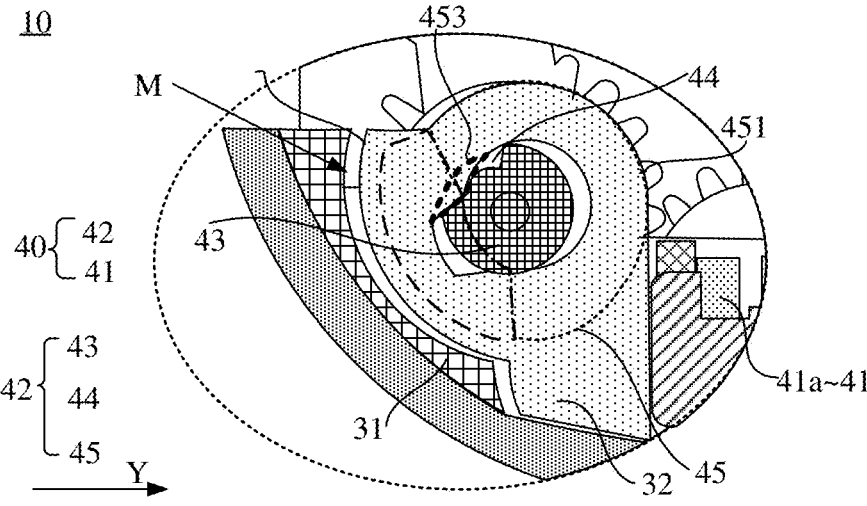
FIG. 9 is an enlarged view of a folding mechanism in position A shown in FIG. 8 when a display device is in an unfolded state, in accordance with some embodiments of the present disclosure.

As shown in FIGS. 8 and 9, the cam collar 45 includes a body portion 451 and a protruding portion 452. The protruding portion 452 is disposed on a side of the cam collar 45 away from the spring 41, and a protruding block 453 is formed at a connection between the protruding portion 452 and the body portion 451. The protruding block 453 faces the inside of the cam collar 45, and matches the depression 44.

When the display device 100 is in the unfolded state, as shown in FIG. 9, the depression 44 faces the protruding block 453, and under the stretching force of the spring 41, the protruding block 453 is engaged into the depression 44, and the second module base 32 slides in the second direction Y away from the first module base 31, so that the second support plate 34 is away from the first support plate 33. When the display device 100 is in the folded state or in a third state between the folded state and the unfolded state, as shown in FIG. 8, the depression 44 is separated from the protruding block 453, and the second module base 32 slides in the second direction Y close to the first module base 31, so that the second support plate 34 is close to the first support plate 33.

For example, as shown in FIG. 8, when the display device 100 is in the folded state or in the third state between the folded state and the unfolded state, the co-moving gear shaft 43 rotates in the area where the body portion 451 of the cam collar 45 is located. The ring of the body portion 451 of the cam collar 45 may be designed as a circular ring. The co-moving gear shaft 43 is clearance-fitted with the ring of the body portion 451 of the cam collar 45. Due to the tension of the spring 41, the side of the co-moving gear shaft 43 away from the spring 41 will be in close contact with the inner wall of the ring of the body portion 451. In this case, the cam collar 45 has the function of blocking the second module base 32 from sliding to the right.

For example, as shown in FIG. 9, when the display device 100 is in the third state between the folded state and the unfolded state, due to the tension of the spring 41, the cam collar 45 fixed to the second module base 32 and the second module base 32 slide to the right together; and the co-moving gear shaft 43 is located in the area between the body portion 451 and the protruding portion 452 of the cam collar 45, and the protruding block 453 is engaged into the depression 44. Thus, the gap M between the first module base 31 and the second module base 32 in the second direction Y is increased. As a result, the distance between the first support plate 33 and the second support plate 34 is increased, which will stretch and flatten the portion of the flexible display panel 50 in the area Z (see FIG. 5).

For example, the size of the depression 44 may be designed to adjust the angle range at which the display device 100 is folded relative to the unfolded state, so that the spring 41 pushes the second module base 32 relatively away from the first module base 31. For example, in a plane perpendicular to the axial direction of the co-moving gear shaft 43, lines are formed between two edges of the opening of the depression 44 and the co-moving gear shaft 43, and an included angle formed by the two lines is 60°. In this case, the display device 100 can be folded within a range of about 0° to 20°, and the spring 41 can push the second module base 32 relatively away from the first module base 31. After the folding angle is greater than 5° to 30°, the spring 41 cannot push the second module base 32 under the force of the cam component 42.

Therefore, when the display device 100 is in the unfolded state, the purpose of stretching and flattening the portion of the flexible display panel 50 in the area Z (see FIG. 5) is achieved by arranging the spring 41 and the cam component 42 in the embodiments of the present disclosure. Moreover, when the display device 100 is in the folded state or in the third state between the folded state and the unfolded state, the spring 41 and the cam component 42 will not apply a tightening force to the flexible display panel 50, thereby improving the service life of the display device 100.

In some embodiments, as shown in FIG. 6, the tension module 40 further includes a first guide member 46 fixed to the covering member 20. The first guide member 46 is used to guide the spring 41 to extend out and retract in the second direction Y.

The arrangement of the first guide member 46 may provide a guiding effect on the tension direction of the spring 41, and prevent the tension of the spring 41 from deviating in other directions away from the second direction Y. In addition, it also has a limiting effect on the position of the spring 41.

In some embodiments, as shown in FIG. 6, the first guide member 46 includes a stop plate 461 and a guide shaft 462 fixed to the stop plate 461. The stop plate 461 is fixed to the covering member 20. The axial direction of the guide shaft 462 is parallel to the second direction Y, the spring 41 is coaxially sleeved on the guide shaft 462, and the first end 41*a* of the spring 41 is against the stop plate 461.

For example, the stop plate 461 is fixed to the covering member 20, and the first end 41*a* of the spring 41 is against the stop plate 461. Since the spring 41 is in the compressed state, the first end 41a of the spring 41 is in a fixed state relative to the covering member 20.

The axial direction of the guide shaft 462 is arranged parallel to the second direction Y, and the spring 41 is coaxially sleeved on the guide shaft 462, which may achieve the purpose of providing the guiding effect on the tension direction of the spring 41, and preventing the tension of the spring 41 from deviating in other directions away from the second direction Y.

In some embodiments, as shown in FIGS. 3, 4 and 6, the second module base 32 is provided with a first accommodation cavity 321 therein, and the first guide member 46 and the spring 41 are disposed in the first accommodation cavity 321.

The first accommodation cavity 321 can be understood as a cavity space that passes through the second module base 32. The first guide member 46 and the spring 41 are disposed in the first accommodation cavity 321 of the second module base 32, which may make more reasonable use of space, reduce the volume occupied by the tension module 40, and is conducive to miniaturization of the display device 100.

Moreover, the second end 41b of the spring 41 may be pressed against the second module base 32 more conveniently, so as to facilitate applying tension in the second direction Y to the second module base 32.

In some embodiments, as shown in FIG. 3, the plurality of co-moving gears 61 include an even number of co-moving gears 61 that mesh in sequence, and the even number of co-moving gears 61 are arranged symmetrically with respect to the first axis L1. The axial direction of the co-moving gear 61 is parallel to the first direction X.

For example, the even number of co-moving gears 61 is four co-moving gears 61, and the four co-moving gears 61 mesh in sequence. Two co-moving gears 61 are disposed on one side of the first axis L1, and the other two co-moving gears 61 are disposed on the other side of the first axis L1.

As shown in FIG. 3, the gear set 60 further includes a gear base 62, a first gear rod 63 and a second gear rod 64. The gear base 62 is fixed to the covering member 20, and the co-moving gear 61 can rotate around the axial direction of the co-moving gear 61 relative to the gear base 62.

The first gear rod 63 and the second gear rod 64 are arranged symmetrically with respect to the first axis L1. Two co-moving gears 61, relatively far away from the first axis L1, in the even number of co-moving gears 61 are a first co-moving gear 61a and a second co-moving gear 61a. A first end of the first gear rod 63 is fixed to the outer edge of the first co-moving gear 61a, and a second end of the first gear rod 63 extends in a direction perpendicular to the first direction X. A first end of the second gear rod 64 is fixed to the outer edge of the second co-moving gear 61b, and a second end of the second gear rod 64 extends in the direction perpendicular to the first direction X. The first gear rod 63 is used to drive the first support plate 33 to rotate, and the first support plate 33 can move relative to the first gear rod 63. The second gear rod 64 is used to drive the second support plate 34 to rotate, and the second support plate 34 can move relative to the second gear rod 64.

For example, the arrangement of the even number of co-moving gears 61 enables linkage between the two co-moving gears 61 relatively far away from the first axis L1. Moreover, when the first gear rod 63 and the second gear rod 64 are linked, the display device 100 may be unfolded and folded.

When the first gear rod 63 and the second gear rod 64 are symmetrically unfolded relative to the first axis L1, the first support plate 33 and the second support plate 34 unfold relative to each other under the driving of the first gear rod 63 and the second gear rod 64, thereby achieving the unfolding of the display device 100.

When the first gear rod 63 and the second gear rod 64 are symmetrically closed relative to the first axis L1, the first support plate 33 and the second support plate 34 fold relative to each other under the driving of the first gear rod 63 and the second gear rod 64, thereby achieving the folding of the display device 100.

For example, the first end of the co-moving gear shaft 43 is coaxially fixed with the first co-moving gear 61a.

Figure 10:
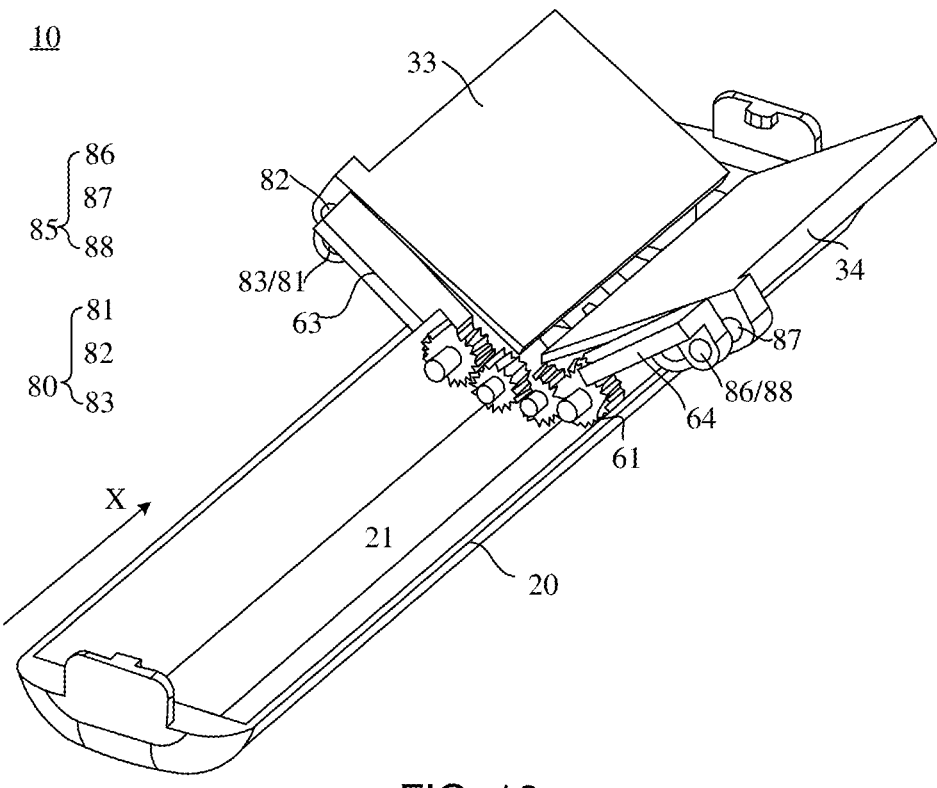
FIG. 10 is a structural diagram of another folding mechanism, in accordance with some embodiments of the present disclosure.

It should be noted that, as for the relative positions of the first support plate 33 and the second support plate 34 with the first gear rod 63 and the second gear rod 64, reference may be made to FIG. 10.

For example, as shown in FIG. 10, when the first gear rod 63 drives the first support plate 33 to rotate, the positions of the first support plate 33 and the first gear rod 63 are not fixed to each other, and the movement trajectory of the first support plate 33 is limited by the first module base 31 (for details, reference is made to the following content, which will not be repeated here).

For example, when the second gear rod 64 drives the second support plate 34 to rotate, the positions of the second support plate 34 and the second gear rod 64 are not fixed to each other, and the movement trajectory of the second support plate 34 is limited by the second module base 32 (for details, reference is made to the following content, which will not be repeated here).

Figure 11:
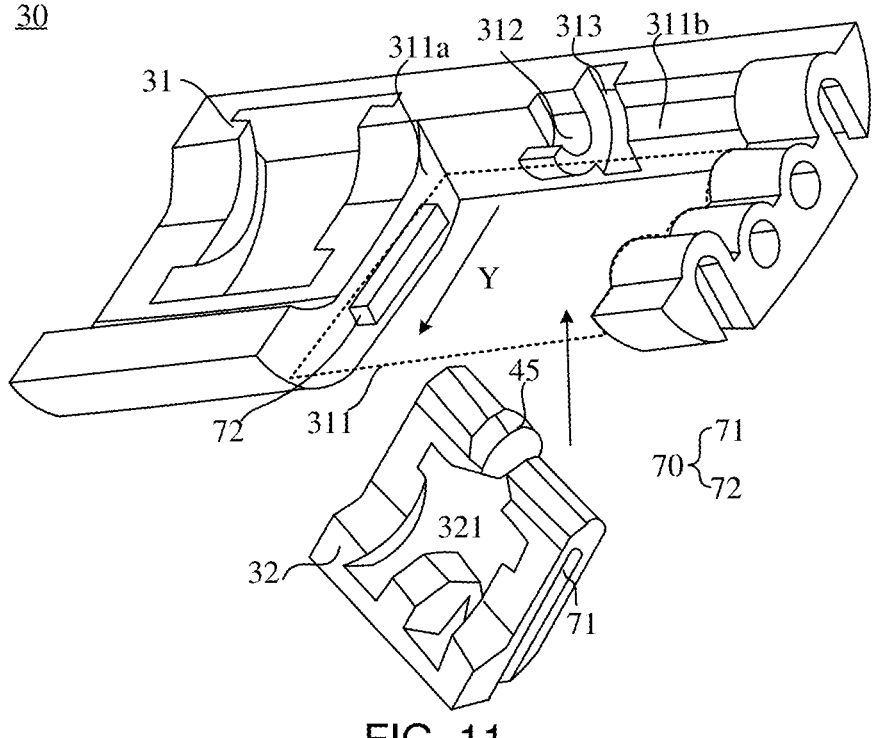
FIG. 11 is a diagram showing a disassembled state of a first module base and a second module base, in accordance with some embodiments of the present disclosure.

In some embodiments, as shown in FIG. 11, the first module base 31 is provided with a second accommodation cavity 311 therein, and the second module base 32 is disposed in the second accommodation cavity 311.

A second guide member 70 is provided between the first module base 31 and the second module base 32. The second module base 32 is slidably connected to the first module base 31 through the second guide member 70, so that the second module base 32 slides back and forth in the second direction Y relative to the first module base 31.

For example, the second accommodation cavity 311 may be a U-shaped notch, and the second module base 32 is placed in the notch. With this design, the display device 100 is compact in structure, the space is saved, and the cooperation of the first module base 31 and the second module base 31 is facilitated.

Moreover, the second guide member 70 defines the sliding direction of the first module base 31 relative to the second module base 32, so that the second module base 32 can only slide in the second direction Y relative to the first module base 31, so as to avoid the distortion of the flexible display panel 50 caused by the direction deviation.

In some embodiments, as shown in FIG. 11, the second guide member 70 includes a second guide rail 72 and a second guide rail groove 71. The second guide rail 72 is fixed to a first side wall 311a of the first module base 31 facing the second accommodation cavity 311. The first side wall 311a extends in the second direction Y, and the second guide rail 72 extends in the second direction Y. The second guide rail groove 71 is disposed on a side wall of the second module base 32. The second guide rail groove 71 is matched with the second guide rail 72, and the second guide rail groove 71 can slide back and forth along the second guide rail 72.

Through the sliding connection of the second guide rail 72 and the second guide rail groove 71, the purpose that the second module base 32 slides back and forth along the second direction Y relative to the first module base 31 may be achieved.

For example, two sets of matching second guide rails 72 and second guide rail grooves 71 (i.e., two second guide members 70) can be provided, and the two second guide members 70 can be designed on two opposite surfaces of the first module base 31 facing the second accommodation cavity 311, e.g., the first side wall 311*a* and the side wall opposite to the first side wall 311*a*, thereby achieving the stable sliding connection between the second module base 32 and the first module base 31.

In some embodiments, as shown in FIG. 11, a support bracket 312 is fixed on the first module base 31, and the support bracket 312 is fixed on the second side wall 311*b* of the first module base 31 facing the second accommodation cavity 311. The second side wall 311*b* extends in the first direction X. Moreover, as shown in FIG. 3, the support bracket 312 is located on a side of the cam collar 45 in the first direction X. The support bracket 312 is used to support the co-moving gear shaft 43, and the co-moving gear shaft 43 can rotate relative to the support bracket 312.

For example, the second accommodation cavity 311 is the U-shaped notch, a side wall extending in the first direction is the second side wall 311*b*, and the second side wall 311*b* is located on a side of the first end 41*a* of the spring 41 away from the second end 41*b* of the spring 41. In this way, the first end of the co-moving gear shaft 43 and the co-moving gear 61 may be coaxially fixed, and the second end of the co-moving gear shaft 43 may be supported and limited by the support bracket 312, which makes the co-moving gear shaft 43 run more smoothly, improves the assembly quality of the display device 100.

In some embodiments, as shown in FIG. 11, the second side wall 311*b* of the first module base 31 is further provided therein with an evading depression 313 for accommodating the cam collar 45, and the evading depression 313 is communicated with the second accommodation cavity 311.

When the display device 100 is from the unfolded state to the folded state, the cam collar 45 moves in the second direction Y proximate to the evading depression 313, so that the second support plate 34 is close to the first support plate 33.

For example, as shown in FIG. 3, the cam collar 45 is fixed on the side of the second module base 32 close to the first module base 31 in the second direction Y, and the cam collar 45 and the second module base 32 move at the same time. By designing the evading depression 313 on the first module base 31, it is possible to prevent the first module base 31 from blocking the movement of the second module base 32, facilitate the sliding of the second module base 32, and achieve the purpose of sliding of the second support plate 34 proximate to the first support plate 33.

In some embodiments, as shown in FIG. 10, a first connection member 80 is provided between the first gear rod 63 and the first support plate 33. Through the first connection member 80, the first gear rod 63 can drive the first support plate 33 to rotate, and the first support plate 33 can move relative to the first gear rod 63.

A second connection member 85 is provided between the second gear rod 64 and the second support plate 34. Through the second connection member 85, the second gear rod 64 can drive the second support plate 34 to rotate, and the second support plate 34 can move relative to the second gear rod 64.

That is to say, with the arrangement of the first connection member 80, the first gear rod 63 has a driving effect on the rotation of the first support plate 33; and with the arrangement of the second connection member 85, the second gear rod 64 has a driving effect on the rotation of the second support plate 33. Thus, the linkage between the first support plate 33 and the second support plate 34 is achieved. However, the first gear rod 63 and the second gear rod 64 do not affect the adjustment of the distance between the first support plate 33 and the second support plate 34.

In some embodiments, as shown in FIG. 10, the first connection member 80 includes a first clamping hole 81, a first waist-hole 82 and a first connection shaft 83. The first clamping hole 81 is disposed on the second end of the first gear rod 63, and the axial direction of the first clamping hole 81 is perpendicular to the extending direction of the first gear rod 63. The first waist-hole 82 is disposed on the side of the first support plate 33 facing the first gear rod 63, and the first waist-hole 82 corresponds to the first clamping hole 81. The first connection shaft 83 passes through the first clamping hole 81 and the first waist-hole 82, and the first connection shaft 83 can move relative to the first waist-hole 82.

With the arrangement of the first clamping hole 81, the first waist-hole 82 and the first connection shaft 83, the first gear rod 63 is connected to the first support plate 33, so that the first gear rod 63 drives the first support plate 33 to rotate. The first waist-hole 82 is disposed on the first support plate 33, which allows the first connection shaft 83 to slide relative to the first waist-hole 82 in the extending direction of the first waist-hole 82. Alternatively, it allows the first connection shaft 83 to rotate relative to the first waist-hole 82, enabling the first gear rod 63 to drive the first support plate 33 to rotate, and avoiding restrictions on the first support plate 33.

Therefore, the movement of the first connection shaft 83 relative to the first waist-hole 82 here includes rotation and sliding.

In some embodiments, as shown in FIG. 10, the second connection member 85 includes a second clamping hole 86, a second waist-hole 87 and a second connection shaft 88. The second clamping hole 86 is disposed on the second end of the second gear rod 64, and the axial direction of the second clamping hole 86 is perpendicular to the extending direction of the second gear rod 64. The second waist-hole 87 is disposed on the side of the second support plate 34 facing the second gear rod 64, and the second waist-hole 87 corresponds to the second clamping hole 86. The second connection shaft 88 passes through the second clamping hole 86 and the second waist-hole 87, and the second connection shaft 88 can move relative to the second waist-hole 87.

With the arrangement of the second clamping hole 86, the second waist-hole 87 and the second connection shaft 88, the second gear rod 64 is connected to the second support plate 34, so that the second gear rod 64 drives the second support plate 34 to rotate. The second waist-hole 87 is disposed on the second support plate 34, which allows the second connection shaft 88 to slide relative to the second waist-hole 87 in the extending direction of the second waist-hole 87. Alternatively, it allows the second connection shaft 88 to rotate relative to the second waist-hole 87, enabling the second gear rod 64 to drive the second support plate 34 to rotate, and avoiding restrictions on the second support plate 34.

Therefore, the movement of the second connection shaft 88 relative to the second waist-hole 87 here includes rotation and sliding.

In some embodiments, as shown in FIG. 4, the covering member 20 has an arc-shaped cross-section in the second direction Y. The covering member 20 includes a first end plate 22, a second end plate 23 and a side wall plate 24. The first end plate 22 is disposed at an end of the covering member 20 in the direction of the first axis L1, the second end plate 23 is disposed at another end of the covering member 20 in the direction of the first axis L1, and the side wall plate 24 is located between the first end plate 22 and the second end plate 23. The first end plate 22, the second end plate 23 and the side wall plate 24 are fixedly connected and enclosed to form the bearing groove 21.

For example, the side wall plate 24 of the covering member 20 is arc-shaped, so that the display device 100 has a smoother appearance and better streamlined appearance when folded. The covering member 20 also has the function of carrying the hinge assembly 30.

Figure 12:
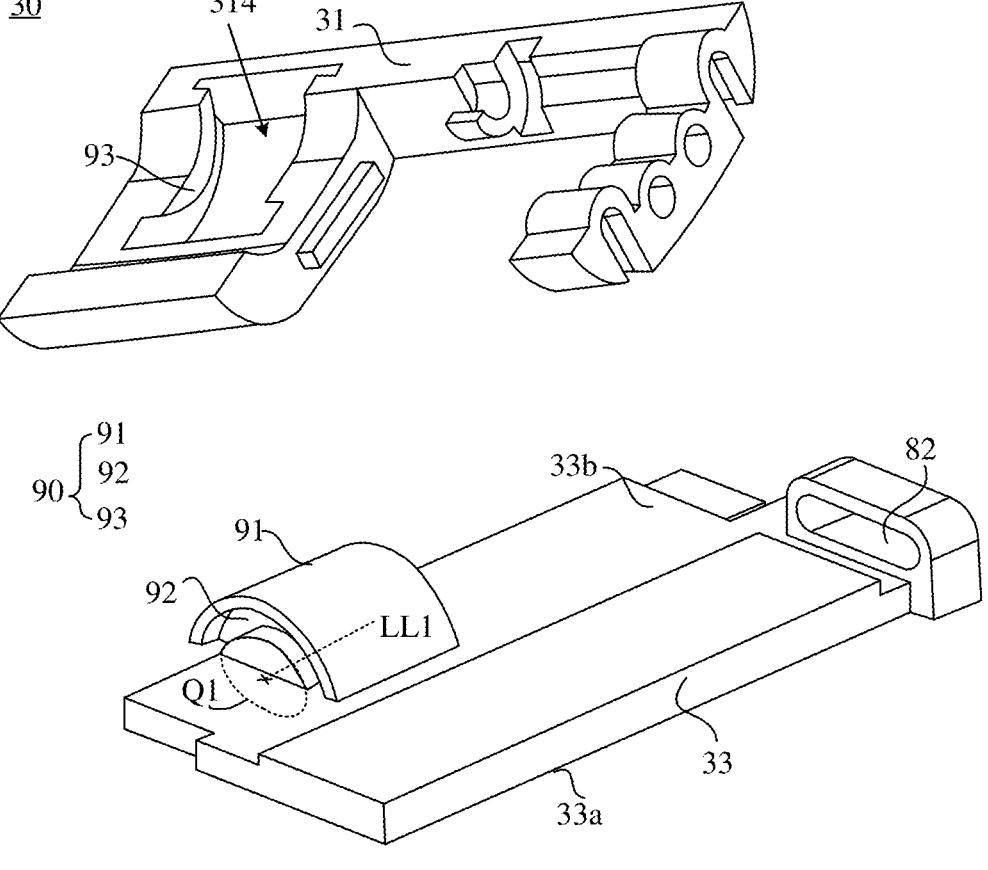
FIG. 12 is a diagram showing a disassembled state of a first module base and a first support plate, in accordance with some embodiments of the present disclosure.

In some embodiments, as shown in FIG. 12, a third guide member 90 is provided between the first support plate 33 and the first module base 31, and the first support plate 33 is rotationally connected to the first module base 31 through the third guide member 90, so that the first support plate 33 rotates relative to the first module base 31 in the direction around the first virtual axis within a preset angle range.

For example, the preset angle is in the range of 0° to 90°, inclusive. When the display device 100 is in the unfolded state, the preset angle is 0°. When the display device 100 is in the folded state, the first support plate 33 rotates by 90° on the first module base 31 through the third guide member 90.

In some examples, as shown in FIG. 12, the third guide member 90 includes a first boss 91, a third guide rail 93 and a third guide rail groove 92, and the first boss 91 is fixed on the second surface 33b of the first support plate 33. The second surface 33b of the first support plate 33 and the first surface 33a of the first support plate 33 are opposite surfaces of the first support plate 33. The first module base 31 is further provided with a third accommodation cavity 314 therein, and the first boss 91 is located in the third accommodation cavity 314. The third guide rail groove 92 is disposed on the first boss 91, and the third guide rail groove 92 is semicircular in the extending direction thereof. The third guide rail 93 is fixed on the side wall of the first module base 31 facing the third guide rail groove 92, and is matched with the third guide rail groove 92. The third guide rail 93 can slide along the third guide rail groove 92.

It should be noted that, in order to more clearly show the structures of the first support plate 33 and the first module base 31, the first support plate 33 and the first module base 31 are placed in a disassembled state in FIG. 12. In a case where the first support plate 33 and the first module base 31 are connected and assembled, the first support plate 33 covers the first module base 31, and the first boss 91 is placed in the third accommodation cavity 314. The third guide rail 93 is fitted in the third guide rail groove 92. When the first support plate 33 rotates, the third guide rail groove 92 rotates along the arc-shaped third guide rail 93, which enables the first support plate 33 to rotate relative to the first module base 31 in the direction around the first virtual axis within the preset angle range.

For example, as shown in FIG. 12, the first virtual axis is an axis LL1 of a virtual circle Q1 where the semicircular third guide rail groove 92 is located.

Figure 13:
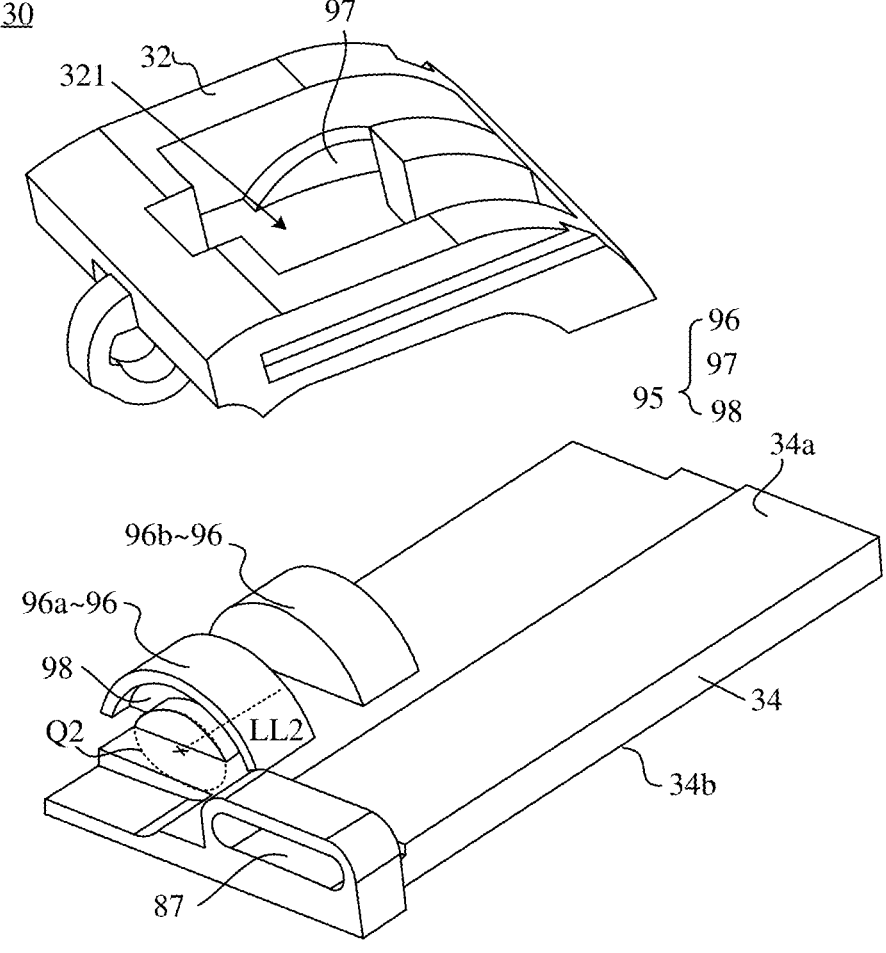
FIG. 13 is a diagram showing a disassembled state of a second module base and a second support plate, in accordance with some embodiments of the present disclosure.

In some embodiments, as shown in FIG. 13, a fourth guide member 95 is provided between the second support plate 34 and the second module base 32, and the second support plate 34 is rotationally connected to the second module base 32 through the fourth guide member 95, so that the second support plate 34 rotates relative to the second module base 32 in the direction around the second virtual axis within a preset angle range.

For example, when the display device 100 is in the folded state, the second support plate 34 rotates by 90° on the second module base 32 through the fourth guide 95; and under the control of the gear set 60, the second support plate 34 is in a linked state with the first support plate 33.

In some examples, as shown in FIG. 13, the fourth guide member 95 includes a second boss 96, a fourth guide rail 97 and a fourth guide rail groove 98, and the second boss 96 is fixed on the second surface 34b of the second support plate 34. The second surface 34b of the second support plate 34 and the first surface 34a of the second support plate 34 are opposite surfaces of the second support plate 34. The second boss 96 is located in the first accommodation cavity 321 of the second module base 32. The fourth guide rail groove 98 is disposed on the second boss 96, and the fourth guide rail groove 98 is semicircular in the extending direction thereof. The fourth guide rail 97 is fixed on the side wall of the second module base 32 facing the fourth guide rail groove 98, and is matched with the fourth guide rail groove 98. The fourth guide rail 97 can slide along the fourth guide rail groove 98.

It should be noted that, in order to more clearly show the structures of the second support plate 34 and the second module base 32, the second support plate 34 and the second module base 32 are placed in a disassembled state in FIG. 13. In a case where the second support plate 34 and the second module base 32 are connected and assembled, the second support plate 34 covers the second module base 32, and the second boss 96 is placed in the first accommodation cavity 321 of the second module base 32. The fourth guide rail 97 is fitted in the fourth guide rail groove 98. When the second support plate 34 rotates, the fourth guide rail groove 98 will rotate along the arc-shaped fourth guide rail 97, which enables the second support plate 34 to rotate relative to the second module base 32 in the direction around the second virtual axis within the preset angle range.

For example, as shown in FIG. 13, the second virtual axis is an axis LL2 of a virtual circle Q2 where the semicircular fourth guide rail groove 98 is located.

It can be understood that the first virtual axis and the second virtual axis are located on opposite sides of the first axis L1.

For example, as shown in FIG. 13, the second boss 96 is located in the first accommodation cavity 321 of the second module base 32; and as shown in FIG. 7, the spring 41 is also located in the first accommodation cavity 321. For example, the second boss 96 includes two parts that are spaced apart, which are a first part 96a and a second part 96b. When the second support plate 34 is covered on the second module base 32, the first part 96a is placed in a first accommodation cavity sub-area 321a on one side of the spring 41, and the second part 96b is placed in a second accommodation cavity sub-area 321b on the other side of the spring 41. That is, the spring is sandwiched between the first part 96a and the second part 96b.

In the above arrangement, the matching first part 96a and second part 96b are arranged outside the spring 41, and have a limiting and guiding function on the outside of the spring 41. As shown in FIG. 6, the guide shaft 462 of the first guide member 46 has a limiting and guiding effect on the inside of the spring 41. It may ensure the accuracy of the tension direction of the spring 41 and ensure that the second module base 32 slides toward the first module base 31 along the second direction Y.

For example, the first part 96a and the second part 96b can each be provided thereon with one fourth guide rail groove 98, and the first module base 31 is provided thereon with respective fourth guide rails 97. This makes the guiding function of the fourth guide member 95 more stable.

With the arrangement of the third guide member 90 and the fourth guide member 95, the first support plate 33 rotates in the preset direction and preset angle range, and the second support plate 34 rotates in the preset direction and preset angle range. Thus, the flexible display panel 50 maintains the flat surface, and even in the process from unfolding to folding the display device 100, the operation stability of the display device 100 can be ensured, and the distortion of the flexible display panel 50 can also be effectively avoided.

In some embodiments, as shown in FIGS. 2 and 4, the at least one hinge assembly 30 includes two hinge assemblies 30, one hinge assembly 30 is disposed at one end of the covering member 20 along the first axis L1, and the other hinge assembly 30 is disposed at the other end of the covering member 20 along the first axis L1. The first support plates 33 of the two hinge assemblies 30 are located on the same side of the first axis L1.

For example, as shown in FIG. 4, a folding mechanism 10 includes two hinge assemblies 30, and the two hinge assemblies 30 are disposed at both ends of the covering member 20. Furthermore, the first support plates 33 of the two hinge assemblies 30 are located on the same side of the first axis L1, and the second support plates 34 of the two hinge assemblies 30 are located on the other side of the first axis L1.

With the arrangement of the two hinge assemblies 30, the two hinge assemblies 30 include two tension modules 40, and the pushing effect of the two tension modules 40 is more conducive to the uniformity of the tension on the flexible display panel 50, so as to ensure the flatness of the flexible display panel 50 better.

In some embodiments, as shown in FIG. 5, the folding mechanism 10 further includes a first middle frame 101 and a second middle frame 102. The first middle frame 101 is fixedly connected to the first support plate 33, and the first surface 101a of the first middle frame 101 is configured to support the flexible display panel 50. The first surface 101a of the first middle frame 101 and the first surface 33a of the first support plate 33 are in the same plane.

The second middle frame 102 is fixedly connected to the second support plate 34, and the first surface 102a of the second middle frame 102 is configured to support the flexible display panel 50. The first surface 102a of the second middle frame 102 and the first surface 34a of the second support plate 34 are in the same plane. In the case where the display device 100 is in the unfolded state, the first surface 101a of the first middle frame 101, the first surface 33a of the first support plate 33, the first surface 102a of the second middle frame 102, and the first surface 34a of the second support plate 34 are in the same plane.

That is to say, the second middle frame 102 can move with the movement of the second support plate 34 in the second direction Y. In the case where the display device 100 is in the unfolded state, the second middle frame 102 is away from the first middle frame 101, and the portion of the flexible display panel 50 located in the area Z will be stretched and flattened to eliminate creases. For example, the second middle frame 102 moves 0.1 mm to 1 mm relative to the first middle frame 101. This distance allows the flexible display panel 50 to be flattened, but does not affect the overall appearance of the display device 100.

Another aspect of the present disclosure provides a display device 100. As shown in FIG. 5, the display device 100 includes a folding mechanism 10 and a flexible display panel 50. The folding mechanism 10 is the folding mechanism 10 as described in any of the above embodiments. The flexible display panel 50 is disposed on a bearing surface of the folding mechanism 10. The bearing surface includes: the first surface 101a of the first middle frame 101, the first surface 33a of the first support plate 33, the first surface 102a of the second middle frame 102, and the first surface 34a of the second support plate 34.

It should be noted that, the display device may be a smart phone, a tablet computer, a television, a display, a notebook computer, or any other product or component having a display function such as a wearable electronic device (e.g., a watch).

Beneficial effects of the display device 100 provided in the embodiments of the present disclosure are the same as the beneficial effects of the folding mechanism 10 as described in any of the above embodiments, which will not be described here again.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A folding mechanism, applied to a display device, comprising:
  a covering member including a bearing groove extending in a first direction, wherein the bearing groove has a first axis extending in the first direction; and
  at least one hinge assembly, wherein each hinge assembly in the at least one hinge assembly includes:
  a first module base and a second module base disposed in the bearing groove, wherein the first module base is fixed to the covering member, and the second module base is capable of sliding back and forth with respect to the first module base in a second direction; the second direction is perpendicular to the first direction, and a plane where the first direction and the second direction are located is parallel to a plane where the display device is in an unfolded state;
  a first support plate and a second support plate disposed on opposite sides of the first axis, wherein the first support plate is connected to the first module base, and the second support plate is connected to the second module base; the first support plate is capable of rotating relative to the first module base, and the second support plate is capable of rotating relative to the second module base, so that the display device is folded or unfolded; a first surface of the first support plate and a first surface of the second support plate are configured to install a flexible display panel thereon;
  a tension module, where in the tension module is used to push the second module base to slide in the second direction away from the first module base when the display device is in the unfolded state, so as to enable the second support plate to move away from the first support plate;
  wherein the tension module includes a spring and a cam component, wherein an axial direction of the spring is parallel to the second direction, a first end of the spring is fixed relative to the covering member, and a second end of the spring is coupled to the second module base;

the cam component is disposed on a side of the first end of the spring away from the second end of the spring, and the cam component is configured as:

during rotation of the display device from a folded state to the unfolded state, under force of the cam component, make the second end of the spring push the second module base to slide in the second direction away from the first module base, so that the second support plate is away from the first support plate; and during rotation of the display device from the unfolded state to the folded state, under the force of the cam component, make the second module base compress the spring, and make the second module base slide in the second direction close to the first module base, so that the second support plate is close to the first support plate.

2. The folding mechanism according to claim 1, wherein the hinge assembly further includes a gear set, the gear set includes a plurality of co-moving gears for driving linkage between the first support plate and the second support plate.

3. The folding mechanism according to claim 2, wherein the cam component includes a co-moving gear shaft and a cam collar, and the cam collar is fixed to the second module base;

a first end of the co-moving gear shaft is coaxially fixed with one co-moving gear in the plurality of co-moving gears, and a second end of the co-moving gear shaft penetrates through the cam collar; the co-moving gear shaft is capable of rotating relative to the cam collar; a portion, penetrating through the cam collar, of the co-moving gear shaft is provided a depression therein, and the depression extends along an axial direction of the co-moving gear shaft;

the cam collar includes a body portion and a protruding portion; the protruding portion is disposed on a side of the body portion away from the spring, and a protruding block is formed at a connection between the protruding portion and the body portion; the protruding block faces an inside of the cam collar and matches the depression;

when the display device is in the unfolded state, the protruding block is engaged into the depression, and the second module base is away from the first module base;

when the display device is in the folded state or in a third state between the folded state and the unfolded state, the depression is separated from the protruding block, and the second module base slides in the second direction close to the first module base.

4. The folding mechanism according to claim 3, wherein the tension module further includes a first guide member fixed to the covering member; the first guide member is used to guide the spring to extend out and retract in the second direction.

5. The folding mechanism according to claim 4, wherein the first guide member includes a stop plate and a guide shaft fixed to the stop plate; the stop plate is fixed to the covering member; an axial direction of the guide shaft is parallel to the second direction, the spring is coaxially sleeved on the guide shaft, and the first end of the spring is coupled to the stop plate.

6. The folding mechanism according to claim 5, wherein the second module base is provided with a first accommodation cavity therein, and the first guide member and the spring are disposed in the first accommodation cavity.

7. The folding mechanism according to claim 6, wherein the plurality of co-moving gears include an even number of co-moving gears that mesh in sequence, and the even number of co-moving gears are arranged symmetrically with respect to the first axis; an axial direction of a co-moving gear is parallel to the first direction;

the gear set further includes:

a gear base fixed to the covering member, wherein the co-moving gear is capable of rotating around the axial direction of the co-moving gear relative to the gear base; and a first gear rod and a second gear rod arranged symmetrically with respect to the first axis, wherein two co-moving gears, relatively far away from the first axis, in the even number of co-moving gears are a first co-moving gear and a second co-moving gear; a first end of the first gear rod is fixed to an outer edge of the first co-moving gear, and a second end of the first gear rod extends in a direction perpendicular to the first direction; a first end of the second gear rod is fixed to an outer edge of the second co-moving gear, and a second end of the second gear rod extends in the direction perpendicular to the first direction; the first gear rod is used to drive the first support plate to rotate, and the first support plate is capable of moving relative to the first gear rod; the second gear rod is used to drive the second support plate to rotate, and the second support plate is capable of moving relative to the second gear rod.

8. The folding mechanism according to claim 7, wherein the first module base is provided with a second accommodation cavity therein, and the second module base is disposed in the second accommodation cavity; and the folding mechanism further comprises a second guide member disposed between the first module base and the second module base; the second module base is slidably connected to the first module base through the second guide member, so that the second module base slides back and forth in the second direction relative to the first module base.

9. The folding mechanism according to claim 8, wherein the second guide member includes a second guide rail and a second guide rail groove; the second guide rail is fixed to a first side wall of the first module base facing the second accommodation cavity; the first side wall extends in the second direction, and the second guide rail extends in the second direction; the second guide rail groove is disposed on a side wall of the second module base; the second guide rail groove is matched with the second guide rail, and the second guide rail groove is capable of sliding back and forth along the second guide rail.

10. The folding mechanism according to claim 8, wherein the folding mechanism further comprises a support bracket fixed on the first module base, and the support bracket is fixed on a second side wall of the first module base facing the second accommodation cavity; the second side wall extends in the first direction;

the support bracket is located on a side of the cam collar in the first direction; the support bracket is used to support the co-moving gear shaft, and the co-moving gear shaft is capable of rotating relative to the support bracket.

11. The folding mechanism according to claim 10, wherein the second side wall of the first module base is provided therein with an evading depression for accommodating the cam collar, and the evading depression is communicated with the second accommodation cavity;

when the display device is from the unfolded state to the folded state, the cam collar moves in the second direction close to the evading depression, so that the second support plate is close to the first support plate.

12. The folding mechanism according to claim 7, further comprising:

a first connection member disposed between the first gear rod and the first support plate, wherein through the first connection member, the first gear rod drives the first support plate to rotate, and the first support plate is capable of moving relative to the first gear rod; and/or a second connection member disposed between the second gear rod and the second support plate, wherein through the second connection member, the second gear rod drives the second support plate to rotate, and the second support plate is capable of moving relative to the second gear rod.

13. The folding mechanism according to claim 12, wherein the first connection member includes a first clamping hole, a first waist-hole and a first connection shaft; the first clamping hole is disposed on the second end of the first gear rod, and an axial direction of the first clamping hole is perpendicular to an extending direction of the first gear rod; the first waist-hole is disposed on a side of the first support plate facing the first gear rod, and the first waist-hole corresponds to the first clamping hole; the first connection shaft passes through the first clamping hole and the first waist-hole, and the first connection shaft is capable of moving relative to the first waist-hole; and/or the second connection member includes a second clamping hole, a second waist-hole and a second connection shaft; the second clamping hole is disposed on the second end of the second gear rod, and an axial direction of the second clamping hole is perpendicular to an extending direction of the second gear rod; the second waist-hole is disposed on a side of the second support plate facing the second gear rod, and the second waist-hole corresponds to the second clamping hole; the second connection shaft passes through the second clamping hole and the second waist-hole, and the second connection shaft is capable of moving relative to the second waist-hole.

14. The folding mechanism according to claim 1, wherein the covering member has an arc-shaped cross-section in the second direction;

the covering member includes a first end plate, a second end plate and a side wall plate; the first end plate is disposed at an end of the covering member in a direction of the first axis, the second end plate is disposed at another end of the covering member in the direction of the first axis, and the side wall plate is located between the first end plate and the second end plate; the first end plate, the second end plate and the side wall plate are fixedly connected and enclosed to form the bearing groove.

15. The folding mechanism according to claim 1, further comprising:

a third guide member disposed between the first support plate and the first module base, wherein the first support plate is rotationally connected to the first module base through the third guide member, so that the first support plate rotates relative to the first module base; and/or a fourth guide member disposed between the second support plate and the second module base, wherein the second support plate is rotationally connected to the second module base through the fourth guide member, so that the second support plate rotates relative to the second module base.

16. The folding mechanism according to claim 15, wherein the third guide member includes a first boss, a third guide rail and a third guide rail groove; the first boss is fixed on a second surface of the first support plate, and the second surface of the first support plate and the first surface of the first support plate are opposite surfaces of the first support plate; the first module base is further provided with a third accommodation cavity therein, and the first boss is located in the third accommodation cavity; the third guide rail groove is disposed on the first boss, and the third guide rail groove is semicircular in an extending direction thereof; the third guide rail is fixed on a side wall of the first module base facing the third guide rail groove, and is matched with the third guide rail groove; the third guide rail is capable of sliding along the third guide rail groove; and/or the fourth guide member includes a second boss, a fourth guide rail and a fourth guide rail groove; the second boss is fixed on a second surface of the second support plate, and the second surface of the second support plate and the first surface of the second support plate are opposite surfaces of the second support plate; the second module base is further provided with a first accommodation cavity therein, and the second boss is located in the first accommodation cavity; the fourth guide rail groove is disposed on the second boss, and the fourth guide rail groove is semicircular in an extending direction thereof; the fourth guide rail is fixed on a side wall of the second module base facing the fourth guide rail groove, and is matched with the fourth guide rail groove; the fourth guide rail is capable of sliding along the fourth guide rail groove.

17. The folding mechanism according to claim 1, wherein the at least one hinge assembly includes two hinge assemblies, one hinge assembly is disposed at one end of the covering member along the first axis, and another hinge assembly is disposed at another end of the covering member along the first axis;

first support plates of the two hinge assemblies are located on a same side of the first axis.

18. The folding mechanism according to claim 1, further comprising a first middle frame and a second middle frame, wherein the first middle frame is fixedly connected to the first support plate, and a first surface of the first middle frame is configured to support the flexible display panel; the first surface of the first middle frame and the first surface of the first support plate are in a same plane;

the second middle frame is fixedly connected to the second support plate, and a first surface of the second middle frame is configured to support the flexible display panel; the first surface of the second middle frame and the first surface of the second support plate are in a same plane;

when the display device is in the unfolded state, the first surface of the first middle frame, the first surface of the first support plate, the first surface of the second middle frame, and the first surface of the second support plate are in a same plane.

19. A display device, comprising:

a folding mechanism the folding mechanism according to claim 1;

a flexible display panel disposed on a bearing surface of the folding mechanism, wherein the bearing surface includes the first surface of the first support plate and the first surface of the second support plate.

* * * * *